United States Patent
Wulff

(10) Patent No.: US 9,065,451 B2
(45) Date of Patent: Jun. 23, 2015

(54) INTEGRATED POWER-ON-RESET CIRCUIT

(71) Applicant: NORDIC SEMICONDUCTOR ASA, Trondheim (NO)

(72) Inventor: Carsten Wulff, Vikhammer (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 0 days.

(21) Appl. No.: 14/106,470

(22) Filed: Dec. 13, 2013

(65) Prior Publication Data

US 2014/0176202 A1    Jun. 26, 2014

(30) Foreign Application Priority Data

Dec. 21, 2012   (GB) .................................. 1223269.0

(51) Int. Cl.
| H03L 7/00 | (2006.01) |
| H03L 5/00 | (2006.01) |
| H03K 17/22 | (2006.01) |

(52) U.S. Cl.
CPC ................ *H03L 5/00* (2013.01); *H03K 17/223* (2013.01)

(58) Field of Classification Search
USPC .......................................... 327/142, 143, 198
See application file for complete search history.

(56) References Cited

U.S. PATENT DOCUMENTS

| 4,260,907 | A |   | 4/1981 | Winebarger |
| 6,084,446 | A | * | 7/2000 | Chen et al. ..................... 327/143 |
| 6,288,584 | B1 | * | 9/2001 | Wu et al. ........................ 327/143 |
| 6,346,834 | B1 |   | 2/2002 | Chai |
| 6,348,806 | B1 |   | 2/2002 | Okandan et al. |
| 6,710,634 | B2 | * | 3/2004 | Ohbayashi et al. ........... 327/143 |
| 6,744,291 | B2 | * | 6/2004 | Payne et al. .................... 327/143 |
| 7,129,939 | B2 | * | 10/2006 | Toyozawa et al. ............. 345/211 |
| 7,193,427 | B2 | * | 3/2007 | Persun et al. ............. 324/762.03 |
| 7,466,171 | B2 | * | 12/2008 | Abadeer et al. ................ 327/143 |
| 7,786,810 | B2 | * | 8/2010 | Liu et al. .......................... 331/17 |
| 2002/0033720 | A1 | * | 3/2002 | Ikehashi et al. ................ 327/143 |
| 2005/0122160 | A1 |   | 6/2005 | Abadeer et al. |
| 2006/0170487 | A1 | * | 8/2006 | Abadeer et al. ................ 327/538 |
| 2014/0118034 | A1 | * | 5/2014 | Lemkin et al. ................. 327/143 |

FOREIGN PATENT DOCUMENTS

| EP | 0479202 | 9/1991 |
| JP | 2005253106 | 9/2005 |

OTHER PUBLICATIONS

European Search Report from European Patent Appl. No. EP 13194674, dated Apr. 7, 2014.

Lin, et al., "A sub-pW timer using gate leakage for ultra low-power sub-Hz monitoring systems", Dept. of EECS, University of Michigan 1301 Beal Ave., Ann Arbor, MI 48109-2122.

* cited by examiner

*Primary Examiner* — Brandon S Cole

(74) *Attorney, Agent, or Firm* — Koppel, Patrick, Heybl & Philpott

(57) ABSTRACT

An integrated power-on reset circuit comprises a resistor and a capacitor, wherein the resistor is arranged to pass a current by quantum tunneling in order to charge the capacitor.

14 Claims, 3 Drawing Sheets

INTEGRATED POWER-ON-RESET CIRCUIT

This invention relates to integrated resistor-capacitor circuits. Certain embodiments relate particularly to an integrated power-on reset circuit.

It is known for integrated devices such as microcontrollers or systems-on-chip to contain integrated power-on reset circuits. When the device is first powered up, the supply voltage ($V_{DD}$) will typically take some time to reach its normal operating voltage. The purpose of the power-on reset circuit is to keep the rest of the device in a state of reset until after the voltage has stabilized. This then allows the device to start running in a known state once the supply voltage has stabilized.

Such power-on reset circuits typically use the charging of a capacitor in a resistor-capacitor circuit to implement a time delay for the reset operation, based on the time taken for the voltage at the capacitor to pass a threshold level.

For some devices, the reset time period may need to be in the order of milliseconds. However this requires the circuit to use a large resistance and capacitance; e.g. 10 megaohms and 160 picofarads for a 10 millisecond time constant. If such a resistor were fabricated in an integrated circuit as a strip of resistive layer, it would take up a large area of silicon, which is costly.

Resistance in such integrated power-on reset circuits has therefore been provided instead between the source and drain of a transistor (e.g. a diode-connected transistor) operating in a state of deep sub-threshold conduction. Such a transistor can be much smaller in area than a resistive strip.

Such an approach is still not ideal, however. The resistance of transistors operating in deep sub-threshold can be heavily dependent on temperature, voltage and process variation. To cope with this variation, a power-on reset circuit must be designed with a conservatively long reset delay, to ensure the supply voltage will have stabilized in all temperature conditions. More significantly still, there can be substantial chip-to-chip variation in the reset period, due to slight process variations. This variation can have the consequence of slowing down the testing stage of chip manufacture, because the test routine for the digital logic must include a delay, after applying power to a chip, corresponding to the longest reset delay that could reasonably occur across the chips, before it starts testing the digital logic; otherwise, good chips may incorrectly be flagged as faulty if testing starts before the reset period has elapsed. A slow test phase is undesirable as it can affect production capacity.

The present invention seeks to address such shortcomings.

From a first aspect, the invention provides an integrated power-on reset circuit comprising a resistor and a capacitor, wherein the resistor is arranged to pass a current by quantum tunneling in order to charge the capacitor.

From a second aspect, the invention provides a device comprising an integrated power-on reset circuit, wherein the power-on reset circuit comprises a resistor and a capacitor, wherein the resistor is arranged to pass a current by quantum tunneling in order to charge the capacitor.

Thus it will be seen by those skilled in the art that a power-on-reset circuit in accordance with the invention charges a capacitor without requiring a long resistance strip and without requiring use of sub-threshold conduction through a transistor.

Instead, quantum tunneling effects can be used to provide an integrated power-on reset circuit that is compact and can avoid the high variability of a sub-threshold conduction transistor. This in turn can allow for a more efficient test procedure of devices containing a power-on reset circuit embodying the invention.

The resistor is preferably arranged or designed such that quantum tunneling is the sole or principle mechanism by which current passes through the resistor.

The resistor may take any form, but preferably comprises an insulating layer, such as an oxide layer. This layer preferably has a thickness of less than about 10 nanometers; more preferably less than around 5 nanometers. The thickness of the layer may here refer to its average (e.g. mean) thickness, or its maximum thickness. The layer will typically be of substantially uniform thickness. In preferred embodiments, the insulating layer may have a thickness of around 2 or 3 nanometers, although in some embodiments it could be less than 1 nanometer thick.

In a preferred set of embodiments, the resistor comprises a field-effect transistor (FET), arranged such that, in use, a current quantum tunnels across the gate dielectric of the transistor. The resistor may comprise more than one insulating layers; for instance, it may comprise two or more field-effect transistors having their gate dielectrics arranged in series or in parallel.

The power-on reset circuit may, of course, comprise additional resistors, which need not necessarily operate principally by quantum tunneling.

The capacitor may take any suitable form. In some embodiments, it comprises a field-effect transistor arrange to store charge across the gate dielectric of the transistor.

The capacitor may have a dielectric layer (e.g. a gate oxide layer) with a thickness of around 6 nanometers or more. The thickness of the layer may here refer to its average (e.g. mean) thickness, or its minimum thickness. The layer will typically be of substantially uniform thickness.

A dielectric layer of the capacitor, for holding an electric field, is preferably thicker than an insulating layer (e.g. gate oxide layer) of the resistor. The thickness of the insulating layer of the resistor may, for instance, be 5 nanometers or less, while the dielectric layer of the capacitor may be 6 nanometers or more thick.

The resistor and capacitor in the power-on reset circuit may be arranged in any appropriate manner, and the circuit may comprise further components as will be appreciated by one skilled in the art. The resistor and capacitor may be integrated on any suitable material, such as a semiconductor or plastics substrate, but are preferably integrated on a silicon wafer.

One side of the resistor may be connected (directly or indirectly) to a supply voltage rail ($V_{DD}$), with the other side being connected to a positive-voltage side of the capacitor (directly or via one or more further components). The other side of the capacitor may be connected (directly or indirectly) to ground.

In some embodiments, the drain and source (and optionally bulk) of a p-channel metal-oxide-semiconductor field-effect transistor (pMOS) forming the resistor are connected (directly or indirectly) to the higher potential (e.g. the supply voltage rail side), while the gate is connected (directly or indirectly) to the positive-voltage side of the capacitor. Connecting the resistor this way round can avoid the problem of the well diodes being turned on.

Similarly, in some embodiments, an n-channel metal-oxide-semiconductor field-effect transistor (nMOS) forming the capacitor is arranged with its drain and source (and optionally bulk) connected (directly or indirectly) to the lower potential (e.g. ground). The gate of the capacitor may be connected (directly or indirectly) to the lower potential side of the resistor. As well as avoiding the problem of the well diodes being turned on, this arrangement minimizes chip area (other orientations would introduce a separate p-substrate well).

In some embodiments, the power-on reset circuit comprises a central transistor connected between the resistor and the capacitor, controlled by a supply voltage. The gate of the central transistor may be connected directly to the supply voltage ($V_{DD}$), but is preferably connected to a voltage divider. The voltage divider may comprise a number of diode-connected transistors (e.g. six) arranged in series; for instance, three pMOS transistors and three nMOS transistors may be connected in series between $V_{DD}$ and ground, with the gate of the central transistor connected to a point between two of the transistors (e.g. two pMOS transistors down from $V_{DD}$).

Using a voltage derived from, but lower than, the supply voltage can help to protect the insulating layer of the quantum-tunneling resistor from damage due to voltage stress, and can partly decouple the gate-source voltage of the resistor from the supply voltage.

The power-on reset circuit may comprise means for responding to the voltage at the capacitor passing a predetermined level. This means may comprise one or more further components. For instance, the circuit may comprise a Schmitt trigger or other digital detection circuit, such as a buffer chain, to generate a digital output signal. This may be used to assert or deassert a reset signal to other components or logic on the device. In some embodiments, a reset signal may be active-low and thus in an asserted state when the device is first powered on (0v). It may then be de-asserted (taken high) when the voltage at the capacitor passes the above-mentioned predetermined level, thereby defining a reset period for the device from power on to this point. The reset period will be determined by the power-on ramp (the $V_{DD}$ ramping up) and the time it takes the power-on reset capacitor to charge. The power-on ramp (how fast $V_{DD}$ turns on) will typically be much faster than the reset time.

In some embodiments, the circuit also comprises means for discharging the capacitor if the supply voltage to the power-on reset circuit drops below a predetermined acceptable level. In this way, the power-on reset circuit can be readied for issuing a further reset signal as needed if the power rises again. This means may comprise one or more further components, such as a diode-connected transistor connected between the supply voltage and positive-voltage side of the capacitor.

A device comprising the power-on reset circuit may comprise additional components or modules, such as a microcontroller, which may be integrated with the power-on-reset circuit. It may comprise one or more integrated peripherals, such as a radio transmitter and/or receiver (forming a radio-on-a-chip). A power-on reset signal from the reset circuit is preferably distributed to a plurality of components or modules on the device, such as an integrated radio and/or microcontroller.

The applicant has recognized that the idea of using a quantum-tunneling resistor in integrated resistor-capacitor circuits has applications beyond power-on-reset circuits. It may find applications, for instance, in filters.

Thus, from a further aspect, the invention provides an integrated circuit comprising a resistor and a capacitor, wherein the resistor is arranged to pass a current by quantum tunneling in order to charge the capacitor.

From a still further aspect, the invention provides a device comprising an integrated circuit, wherein the circuit comprises a resistor and a capacitor, wherein the resistor is arranged to pass a current by quantum tunneling in order to charge the capacitor.

The integrated circuit may be arranged to act as any one or more of: a low-pass filter, a high-pass filter, a band-pass filter, a band-stop filter, a timer, and a power-on reset generator, as will be apparent to the skilled person.

The resistor and capacitor are preferably arranged in series. Optional features of the resistor and capacitor described with reference to the earlier aspects may be used here also.

More generally, optional or preferred features of any aspect or embodiment described herein may, wherever appropriate, be applied to any other aspect or embodiment.

Certain preferred embodiments of the invention will now be described, by way of example only, with reference to the accompanying drawings, in which:

FIG. 1 shows the circuit diagram of a power-on reset circuit 1 fabricated on a silicon wafer, e.g. as part of a very large-scale integration (VLSI) device. The dashed lines are merely to aid identification of the various functional parts of the device; they are not features of the circuit itself.

Figure 1:
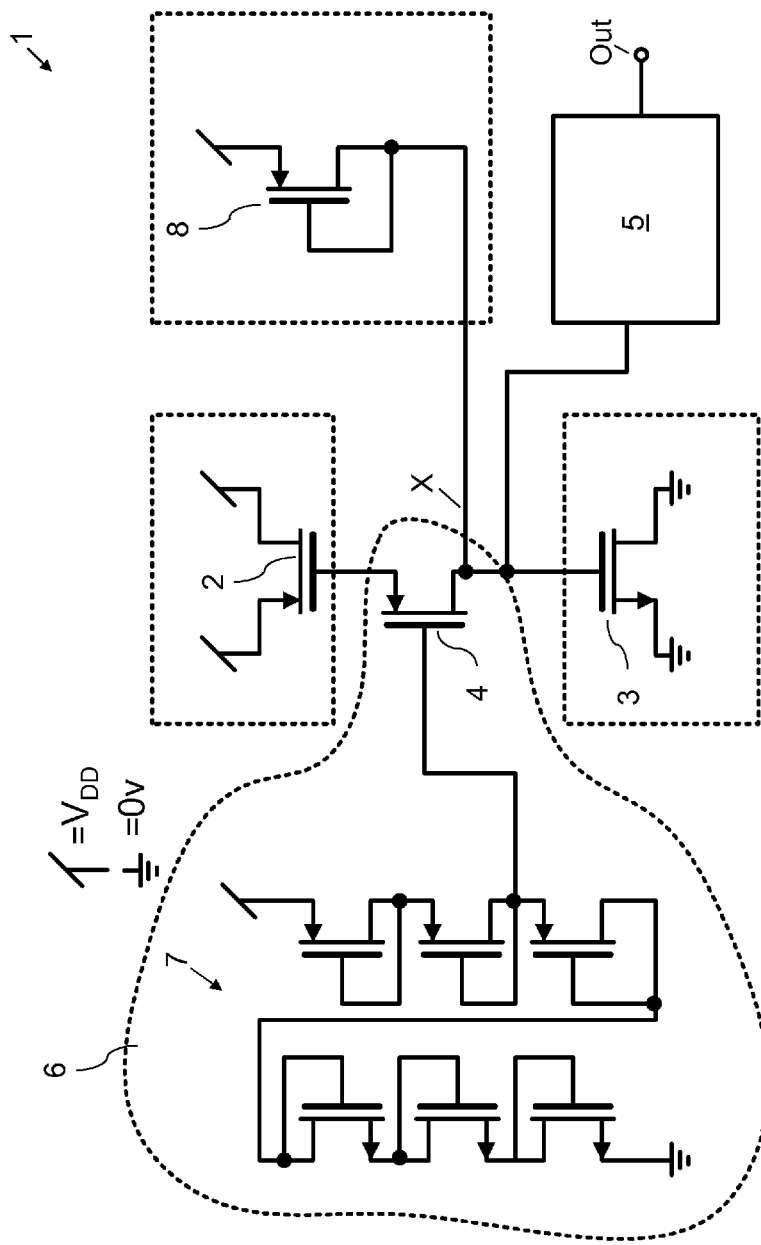
FIG. 1 is a circuit diagram of a power-on reset circuit embodying the invention.

A thin-oxide pMOS transistor 2 is connected in series with a relatively thick-oxide nMOS transistor 3. The thin-oxide transistor 2 is designed to act as a quantum-tunneling resistor, while the thick-oxide transistor 3 is arranged to act a capacitor. The oxide layer of the thin-oxide transistor 2 may be around 2-3 microns, while the oxide layer of the thick-oxide transistor 3 may be around 5-7 microns.

The source and drain of the thin-oxide transistor 2 (resistor) are both connected to the supply voltage ($V_{DD}$), while the source and drain of the thick-oxide transistor 3 (capacitor) are both connected to ground. The gate of the thin-oxide transistor 2 is connected to the gate of the thick-oxide transistor 3, via a central pMOS transistor 4. The gate of the thin-oxide transistor 2 (resistor) is connected to the source of the central transistor 4, while the drain of the central transistor 4 is connected to the gate of the thick-oxide transistor 3 (capacitor).

A digital detection block 5 is also connected to the drain of the central transistor 4. It contains a buffer chain (not shown) which is arranged to change a binary signal at its output (Out) in response to the voltage X at the gate of the thick-oxide transistor 3 (capacitor) passing a predetermined threshold $x_1$.

The circuit contains an overvoltage protection and $V_{DD}$ compensation block 6, which contains the central transistor 4 and a voltage divider 7 made up of a series of six transistors between $V_{DD}$ and ground. Starting from $V_{DD}$, the series consists of three pMOS transistors followed by three nMOS transistors, ending at ground. Each transistor is diode-connected—i.e. it has its drain connected to its gate—so as to act as a resistor. The gate of the central transistor 4 is connected to an appropriate point within the voltage divider, such as two transistors down from $V_{DD}$.

In other embodiments, the overvoltage protection and $V_{DD}$ compensation block 6 may not be present, such that the thin-oxide transistor 2 (resistor) connects directly to the thick-oxide transistor 3 (capacitor). This is less preferred, however, as such an arrangement is more vulnerable to overvoltage damage to the dielectric of the thin-oxide transistor 2.

Also connected to the drain of the central transistor 4 is a further diode-connected pMOS transistor 8, leading to the supply rail $V_{DD}$. It only passes a current when the supply voltage $V_{DD}$ falls below the level at the gate of the thick-oxide transistor 3, at which point it discharges the charge stored on the thick-oxide transistor 3 in order to pull the voltage X low again, so that the power-on reset circuit is ready for when the supply voltage next rises.

Figure 2:
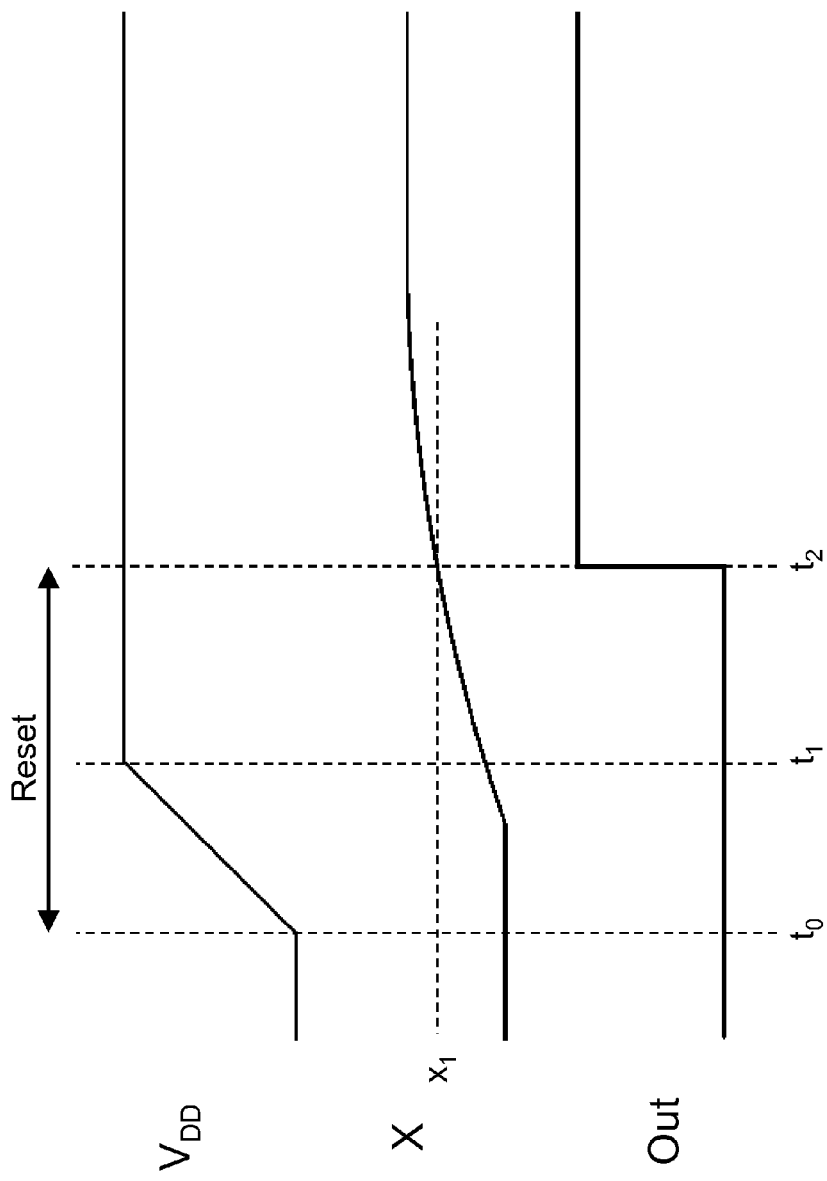
FIG. 2 is an indicative graph of voltage against time at three different points in the circuit.

FIG. 2 illustrates the power-on reset circuit 1 in operation by showing typical voltages over time in the supply rail $V_{DD}$, at the gate of the thick-oxide transistor 3 (capacitor) and at the digital output, Out, of the digital detection block 5.

Power is first supplied to the supply rail $V_{DD}$ at time $t_0$. The voltage rises approximately linearly until it reaches the normal working voltage at time $t_1$. Relevant parts of a device incorporating the circuit are held in a state of reset from the time power is first applied, by means of an active-low reset signal.

The power-on reset circuit 1 is arranged, once $V_{DD}$ has risen to its normal working voltage, to output a binary signal from output Out. This can be used to end (deassert) the reset signal and trigger normal operation of the device. Because the time taken for $V_{DD}$ to stabilize may vary with operating and manufacturing conditions, the power-on reset circuit 1 waits conservatively long and outputs the signal at time $t_2$ well beyond the maximum expected value of $t_1$. The reset period between $t_0$ and $t_2$ might typically last a few milliseconds, e.g. around 5 or 10 milliseconds. This delay also allows time for regulators and clock circuits to start up (although these usually start much faster than 1 millisecond).

The voltage divider 7 and central transistor 4 are arranged so that, as $V_{DD}$ rises, the central transistor 4 starts to pass current. Charge passes from the supply rail, through the thin-oxide resistor 2 by quantum tunneling, then through the central transistor 4, and builds on the gate of the thick-oxide transistor 3, creating an electric field across the gate dielectric of the thick-oxide transistor 3 (capacitor). The voltage X at the gate of the thick-oxide transistor 3 starts to rise slowly, as shown in FIG. 2.

The digital detection block 5 is arranged to output a binary signal from Out when the voltage X passes a predetermined threshold $x_1$, at time $t_2$. The thin-oxide transistor 2 and thick-oxide transistor 3 are dimensioned so that the time taken for this to happen (i.e. the reset period, from $t_0$ to $t_2$) will always be sufficiently large for the supply voltage to stabilize at its normal working level, under all reasonable operating conditions.

If the supply voltage drops substantially, this may be detected by a different circuit (not shown), which may initiate a reset of relevant components. In order to ready the power-on reset circuit 1 for when normal power resumes, the diode-connection transistor 8 is arranged to discharge the thick-oxide transistor 3 (capacitor) if $V_{DD}$ drops below the voltage X at the gate of the thick-oxide transistor 3.

Figure 3:
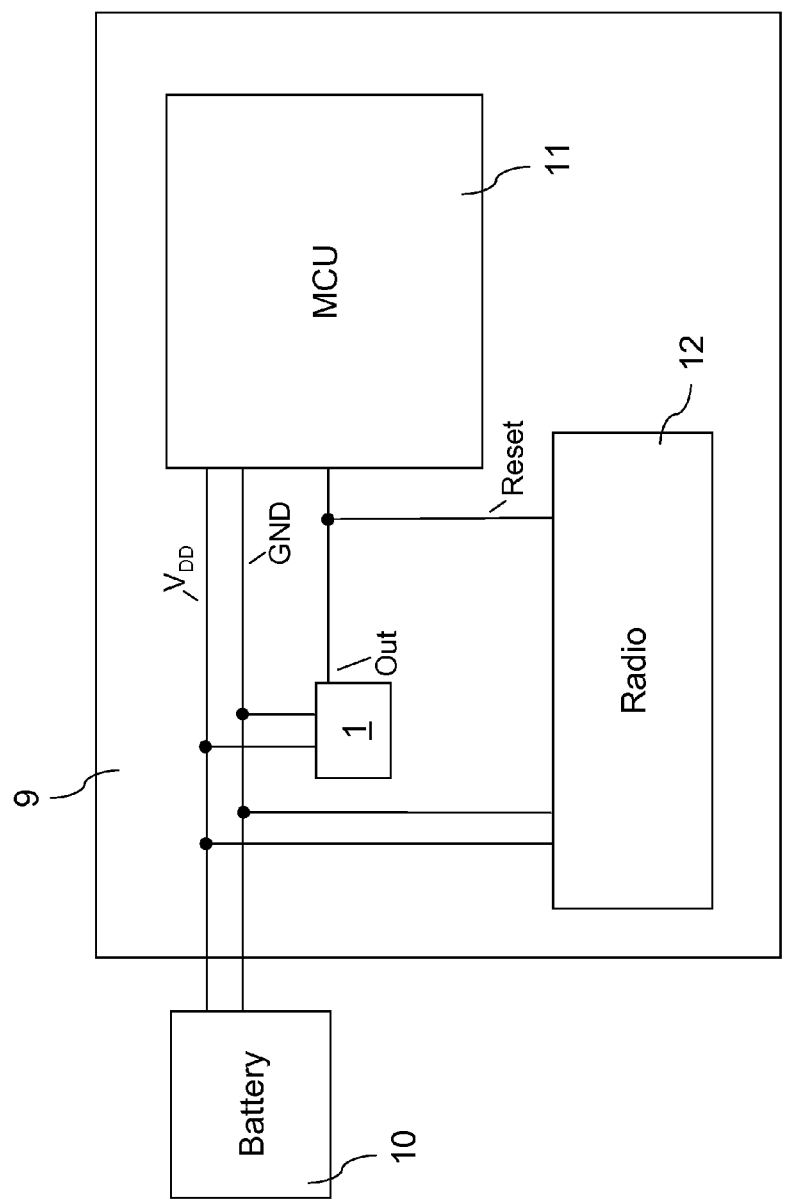
FIG. 3 is a schematic diagram of the power-on reset circuit in a radio-on-a-chip device.

FIG. 3 shows an integrated radio-on-a-chip 9 incorporating the power-on reset circuit 1. An off-chip battery 10 provides a supply $V_{DD}$ and ground rails to the power-on reset circuit 1, to a microcontroller unit 11, and to a radio module 12. (Voltage level-shifters may be used to shift from the battery voltage to core voltages, but these are omitted from FIG. 3 for the sake of simplicity.)

The digital output, Out, of the power-on reset circuit 1 is received as an active-low reset signal to the MCU 11 and the radio module 12. When the output from the power-on reset circuit 1 goes high, this de-asserts the reset signal, so that the MCU 11 and radio module 12 can commence operation in a known state with a steady power supply.

The radio-on-a-chip 9 will, of course, typically have many more components which are not shown here.

Simulations have been carried out of a circuit similar to that in FIG. 1 to estimate the chip-to-chip variation in reset time due to varying process conditions. The simulated circuit had an intentionally long reset time (much longer than would be used in an actual device) for ease of testing. Results suggest a variation from 0.13 seconds to 1 seconds (a maximum of around 8 times the minimum). This compares favorably with simulation results of 0.002 seconds to 0.361 (a maximum of around 180 times the minimum) seconds for an otherwise-similar power-on reset circuit that uses a conventional diode-connected transistor as a resistor, instead of a quantum-tunneling resistor.

In summary, a novel type of integrated resistor-capacitor circuit has been described, which can provide significant improvements in size and in reset-time consistency when used in power-on reset circuits, but which may also have applications to other areas such as filters.

The invention claimed is:

1. An integrated power-on reset circuit comprising a resistor and a capacitor, wherein the resistor is a field-effect transistor with a gate dielectric layer thickness of around 5 nanometers or less and is arranged to pass a current to the capacitor by quantum tunneling of charge through said gate dielectric layer in order to charge the capacitor, and wherein the circuit is an integrated power-on reset circuit and is arranged to output a reset signal when the voltage at a higher-potential side of the capacitor passes a predetermined level.

2. The integrated power-on reset circuit of claim 1, wherein the capacitor comprises a dielectric layer with a thickness of around 6 nanometers or more.

3. The integrated power-on reset circuit of claim 1, wherein the resistor comprises a p-channel metal-oxide-semiconductor field-effect transistor, and wherein the drain and source of the pMOS transistor are connected to a supply voltage rail, while the gate of the pMOS transistor is connected to a higher-potential side of the capacitor.

4. The integrated power-on reset circuit of claim 1, wherein the capacitor comprises an n-channel metal-oxide-semiconductor field-effect transistor, and wherein the drain and source of the nMOS transistor are connected to ground, while the gate of the nMOS transistor is connected to a lower-potential side of the resistor.

5. The integrated power-on reset circuit of claim 1, comprising an overvoltage protection circuit for protecting the gate dielectric layer of the resistor from damage, wherein the overvoltage protection circuit comprises a central transistor connected between the resistor and the capacitor, controlled by a supply voltage.

6. The integrated power-on reset circuit of claim 5, wherein the gate of the central transistor in said overvoltage protection circuit is connected to a voltage divider, so as to receive a voltage that is lower than the supply voltage.

7. The integrated power-on reset circuit of claim 6, wherein the voltage divider comprises a number of diode-connected transistors arranged in series.

8. The integrated power-on reset circuit of claim 1, comprising a discharge circuit for discharging the capacitor if a supply voltage to the power-on reset circuit drops below a predetermined acceptable level.

9. A device of claim 1, comprising the integrated power-on reset circuit of claim 1 and further comprising a microcontroller and one or more peripherals, integrated with the power-on reset circuit, wherein the device is arranged to distribute a reset signal from the power-on reset circuit to the microcontroller and peripherals.

10. An integrated power-on reset circuit comprising a resistor and a capacitor, wherein the resistor comprises an insulating layer and is arranged to pass a current to the capacitor by quantum tunneling through the insulating layer in order to charge the capacitor, and wherein the circuit is an integrated power-on reset circuit and is arranged to output a reset signal when the voltage at the capacitor reaches a predetermined level.

11. The integrated power-on reset circuit of claim 10, comprising an overvoltage protection circuit for protecting the insulating layer of the resistor from damage, wherein the overvoltage protection circuit comprises a central transistor connected between the resistor and the capacitor, controlled by a supply voltage.

12. The integrated power-on reset circuit of claim 11, wherein the gate of the central transistor is connected to a voltage divider, so as to receive a voltage that is lower than the supply voltage.

13. The integrated power-on reset circuit of claim 12, wherein the voltage divider comprises a number of diode-connected transistors arranged in series.

14. The integrated power-on reset circuit of claim 10, further comprising a microcontroller arranged to receive said reset signal.

* * * * *